United States Patent
Hoei

(10) Patent No.: US 8,553,458 B2
(45) Date of Patent: Oct. 8, 2013

(54) METHODS FOR SEGMENTED PROGRAMMING AND MEMORY DEVICES

(71) Applicant: Micron Technology, Inc., Boise, ID (US)

(72) Inventor: Jung-Sheng Hoei, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/721,808

(22) Filed: Dec. 20, 2012

(65) Prior Publication Data

US 2013/0107626 A1    May 2, 2013

Related U.S. Application Data

(63) Continuation of application No. 12/968,714, filed on Dec. 15, 2010, now Pat. No. 8,345,482.

(51) Int. Cl.
    *G11C 16/04*    (2006.01)
(52) U.S. Cl.
    USPC ............. 365/185.18; 365/185.19; 365/185.22
(58) Field of Classification Search
    USPC ............. 365/185.18, 185.19, 185.22, 185.24
    See application file for complete search history.

(56) References Cited

U.S. PATENT DOCUMENTS

| | | | |
|---|---|---|---|
| 6,859,395 B2 | 2/2005 | Matsunaga et al. | |
| 7,280,398 B1 | 10/2007 | Lee | |
| 7,525,849 B2 | 4/2009 | Chen | |
| 7,656,710 B1 | 2/2010 | Wong | |
| 7,751,253 B2 | 7/2010 | Sarin et al. | |
| 8,023,334 B2 | 9/2011 | Hoei et al. | |
| 8,345,482 B2 * | 1/2013 | Hoei | 365/185.18 |
| 2008/0205140 A1 | 8/2008 | Lee et al. | |
| 2008/0259684 A1 | 10/2008 | Shlick et al. | |
| 2009/0052238 A1 | 2/2009 | Shinagawa et al. | |
| 2010/0142267 A1 | 6/2010 | Sarin | |
| 2011/0242900 A1 | 10/2011 | Hoei | |

* cited by examiner

*Primary Examiner* — Gene Auduong
(74) *Attorney, Agent, or Firm* — Leffert Jay & Polglaze, P.A.

(57) ABSTRACT

Methods for segmented programming, program verify, and memory devices are disclosed. One such method for programming includes biasing memory cells with a programming voltage and program verifying the memory cells with a plurality of ramped voltage signal segments, wherein each ramped voltage signal segment has a different start voltage and a different end voltage than the other ramped voltage signal segments.

20 Claims, 8 Drawing Sheets

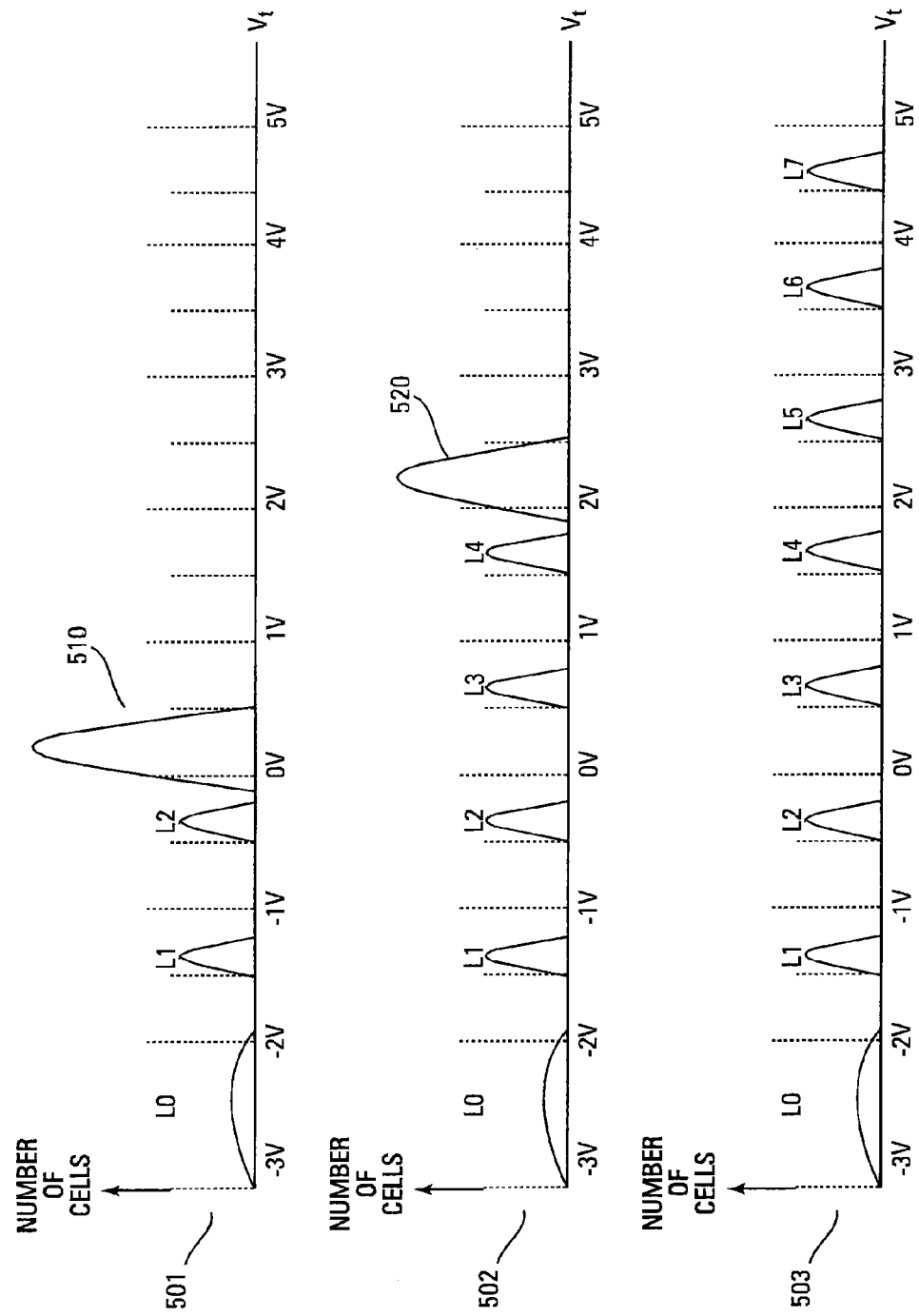

METHODS FOR SEGMENTED PROGRAMMING AND MEMORY DEVICES

RELATED APPLICATION

This is a continuation of U.S. patent Ser. No. 12/968,714, titled "METHODS FOR SEGMENTED PROGRAMMING AND MEMORY DEVICES", filed Dec. 15, 2010 (allowed), which is commonly assigned and incorporated herein by reference.

TECHNICAL FIELD

The present embodiments relate generally to memory and a particular embodiment relates to programming of a memory.

BACKGROUND

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, flash drives, digital cameras, and cellular telephones. Program code and system data such as a basic input/output system (BIOS) are typically stored in flash memory devices for use in personal computer systems.

A typical flash memory device is a type of memory in which the array of memory cells is typically organized into memory blocks that can be erased and reprogrammed on block-by-block basis instead of one byte at a time. Changes in a threshold voltage of each of the memory cells, through erasing or programming of a charge storage structure (e.g., floating gate or charge trap) or other physical phenomena (e.g., phase change or polarization), determine the data value of each cell. The data in a cell of this type is determined by the presence or absence of the charge in the charge storage structure.

A programming operation typically comprises a series of incrementally increasing programming pulses that are applied to a control gate of a memory cell being programmed. A program verify operation after each programming pulse can determine the threshold voltage of the memory cell resulting from the preceding programming pulse.

The program verify operation can comprise applying a ramped voltage signal on the control gate of the memory cell being programmed. When the ramped voltage signal reaches the threshold voltage to which the memory cell has been programmed, the memory cell turns on and sense circuitry detects a current on a data line (e.g., bit line) coupled to the memory cell.

The ramped voltage signal for each program verify operation covers the entire $V_t$ voltage range for the memory cell. For example, if an erased threshold voltage for the memory cell can go as low as −3V and a programmed threshold voltage as high as 5V, the ramped voltage signal will start at −3V and increase to 5V. Thus, each programming operation includes the programming pulse time plus the time to generate the entire program verify ramped voltage signal. Performing such a programming operation on each memory cell of a memory block can use a large amount of time and create a performance bottleneck in a memory system.

For the reasons stated above, and for other reasons that will become apparent to those skilled in the art upon reading and understanding the present specification, there is a need in the art for a more efficient programming operation.

BRIEF DESCRIPTION OF THE DRAWINGS

FIG. 5 shows a plot of one embodiment of the different program states for a multiple level memory cell array in accordance with the method of FIG. 4.

DETAILED DESCRIPTION

Figure 1:
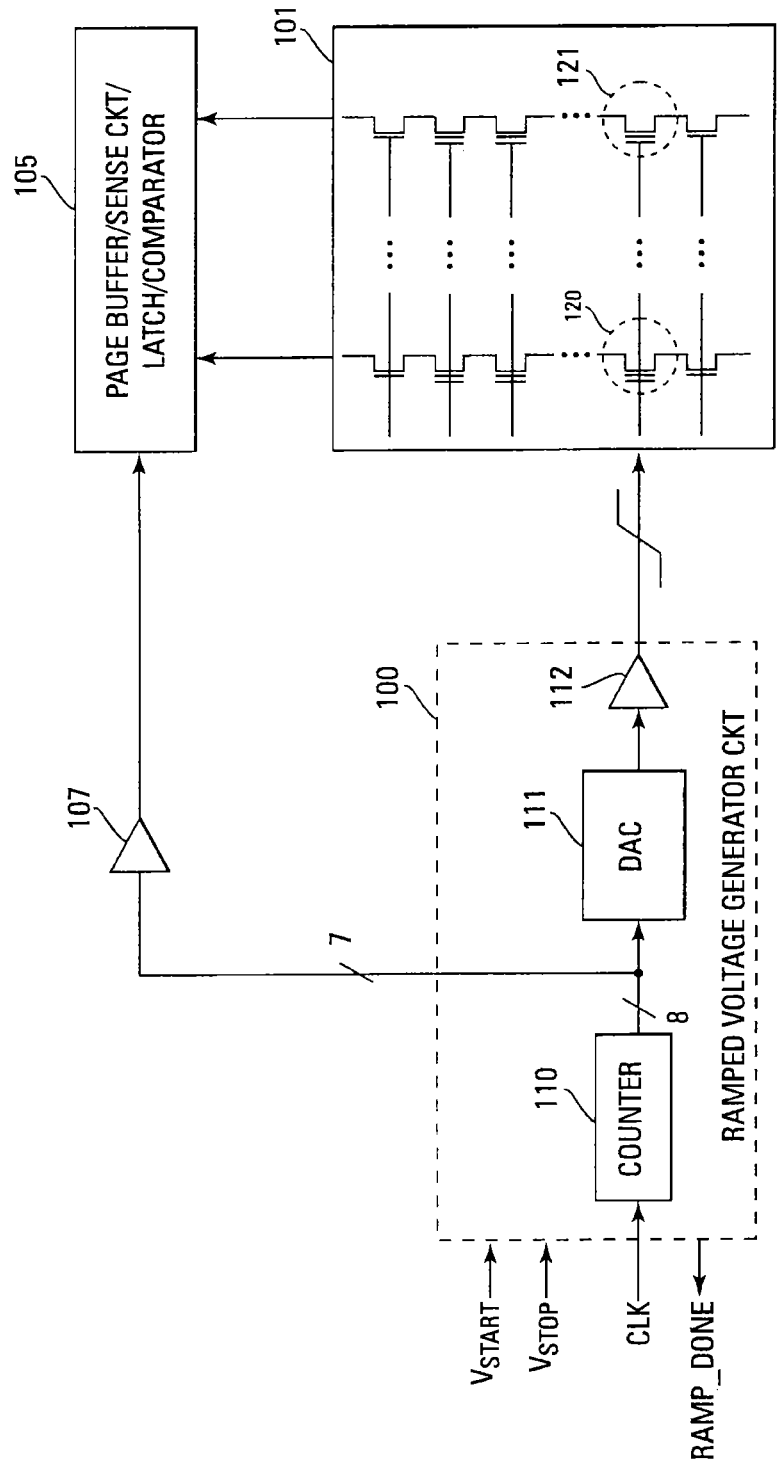
FIG. 1 shows a block diagram of one embodiment of a program verify circuit for a memory array.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 illustrates a block diagram of one embodiment of a program verify circuit for a memory array 101. The memory array 101 to be program verified can be a non-volatile memory array such as the NAND array illustrated in FIG. 2 and described subsequently. Alternate embodiments can use other types of memory arrays. For purposes of illustration, it is assumed that memory cells 120, 121 that are coupled to a selected access line (e.g., word line) are being program verified.

A ramped voltage generator circuit 100 is coupled to the memory array 101. The ramped voltage generator circuit 100 is responsible for generating the ramped voltage signals that are applied to control gates of memory cells via selected word lines during a program verify operation. As described subsequently in greater detail, when the ramped voltage signal increases to the threshold voltage of a selected memory cell to which it is applied, that memory cell is activated and causes a current to flow on a bit line coupled to the selected memory cell. This current is detected by sense circuitry in order to determine the threshold voltage to which the selected memory cell is programmed.

The ramped voltage generator circuit 100 includes a counter 110 that is coupled to a digital-to-analog converter (DAC) 111. The counter 110 counts transitions of a clock input CLK and outputs the count to the digital-to-analog converter 111 that converts the count to an analog ramped voltage signal. The analog ramped voltage signal is input to a buffer 112 that can provide one or more of current gain, voltage gain, and/or electrical impedance transformation from the ramped voltage generator circuit 100 to the memory array 101.

The range of DAC 111 can be defined by $V_{start}$ and $V_{stop}$ to cover the intended $V_t$ range of a ramped voltage signal segment generated by ramped voltage generator circuit 100. The $V_{start}$ and $V_{stop}$ signals can be generated on the same chip (not shown) as the program verify circuit.

Generation of the ramp voltage signal segment can be initiated by turning on CLK to the counter 110. This event can be controlled by a state machine (not shown), which can also be on the same chip as the program verify circuit. Once the ramped voltage signal segment is completed, such as when the counter 110 reaches its maximum count, a signal called "RAMP_DONE" is generated from circuit 100 and sent back to the state machine (not shown) to indicate that the ramped voltage signal segment has reached its stop voltage, $V_{stop}$.

In the embodiment of FIG. 1, the counter 110 is an eight bit counter. The counter 110 thus outputs a binary count from 00000000 to 11111111 (e.g., 0 to 255). The most significant seven bits (e.g., bits 1-7) are output, through a buffer 107, to peripheral circuitry 105. This seven bit count, subsequently referred to as the $V_t$ count, is a binary count from 0000000 to 1111111 (e.g., 0 to 127). When a ramped voltage signal segment (see, e.g., segments 301-303 of FIG. 3) reaches the threshold voltage of the memory cell being programmed, the $V_t$ count is latched into a latch of the peripheral circuitry 105. The latched $V_t$ count is indicative of the threshold voltage of the memory cell being programmed since it corresponds to the count that generated the particular voltage that activated the memory cell.

The peripheral circuitry 105 (e.g., page buffers) includes, in one embodiment, sense circuitry, latches, and comparators. The peripheral circuitry 105 is also coupled to the memory array 101 through, for example, the bit lines. More detailed operation of the peripheral circuitry 105 will be discussed subsequently.

Figure 2:
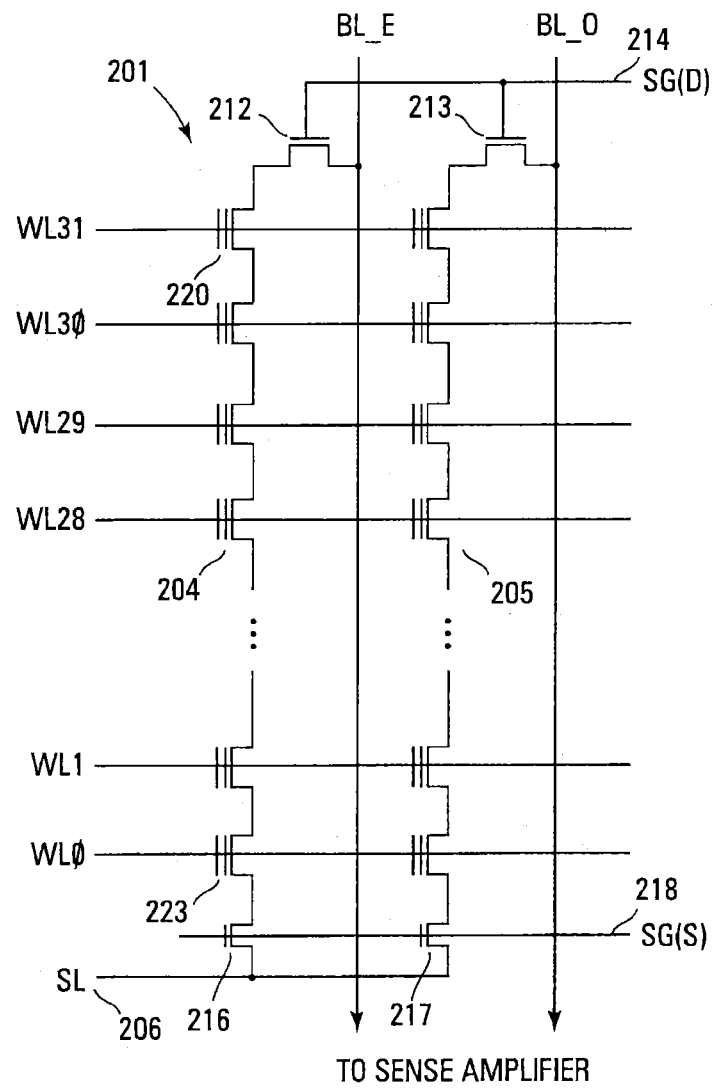
FIG. 2 shows a schematic of a portion of one embodiment of a NAND memory array in accordance with the block diagram of FIG. 1.

FIG. 2 illustrates a schematic diagram of one embodiment of a portion of the NAND architecture memory array 201, as illustrated in FIG. 1, comprising series strings of non-volatile memory cells. The present embodiments of the memory array are not limited to the illustrated NAND architecture. Alternate embodiments can use NOR or other architectures as well.

The memory array 201 comprises an array of non-volatile memory cells (e.g., floating gate) arranged in columns such as series strings 204, 205. Each of the cells is coupled drain to source in each series string 204, 205. An access line (e.g. word line) WL0-WL31 that spans across multiple series strings 204, 205 is coupled to the control gates of each memory cell in a row in order to bias the control gates of the memory cells in the row. Data lines, such as even/odd bit lines BL_E, BL_O, are coupled to the series strings and eventually coupled to sense circuitry that detect the state of each cell by sensing current or voltage on a selected bit line.

Each series string 204, 205 of memory cells is coupled to a source line 206 by a source select gate 216, 217 (e.g., transistor) and to an individual bit line BL_E, BL_O by a drain select gate 212, 213 (e.g., transistor). The source select gates 216, 217 are controlled by a source select gate control line SG(S) 218 coupled to their control gates. The drain select gates 212, 213 are controlled by a drain select gate control line SG(D) 214.

Each memory cell can be programmed as a single level cell (SLC) or a multiple level cell (MLC). Each cell's threshold voltage ($V_t$) is indicative of the data value of that cell. For example, in an SLC, a $V_t$ of 2.5V might indicate a programmed cell while a $V_t$ of –0.5V might indicate an erased cell. An MLC uses multiple $V_t$ ranges that each indicates a different state. Multilevel cells can take advantage of the analog nature of a traditional flash cell by assigning a bit pattern to a specific $V_t$ range. This technology permits the storage of data values representing two or more bits per cell, depending on the quantity of $V_t$ ranges assigned to the cell.

The amount of time to program a memory cell can include the time for the programming pulse plus the time to accomplish the program verify operation after each programming pulse. Each time a memory cell experiences a programming pulse, its threshold voltage can be increased. Therefore, using the same ramped voltage signal each time a memory cell is program verified can waste time.

Figure 3:
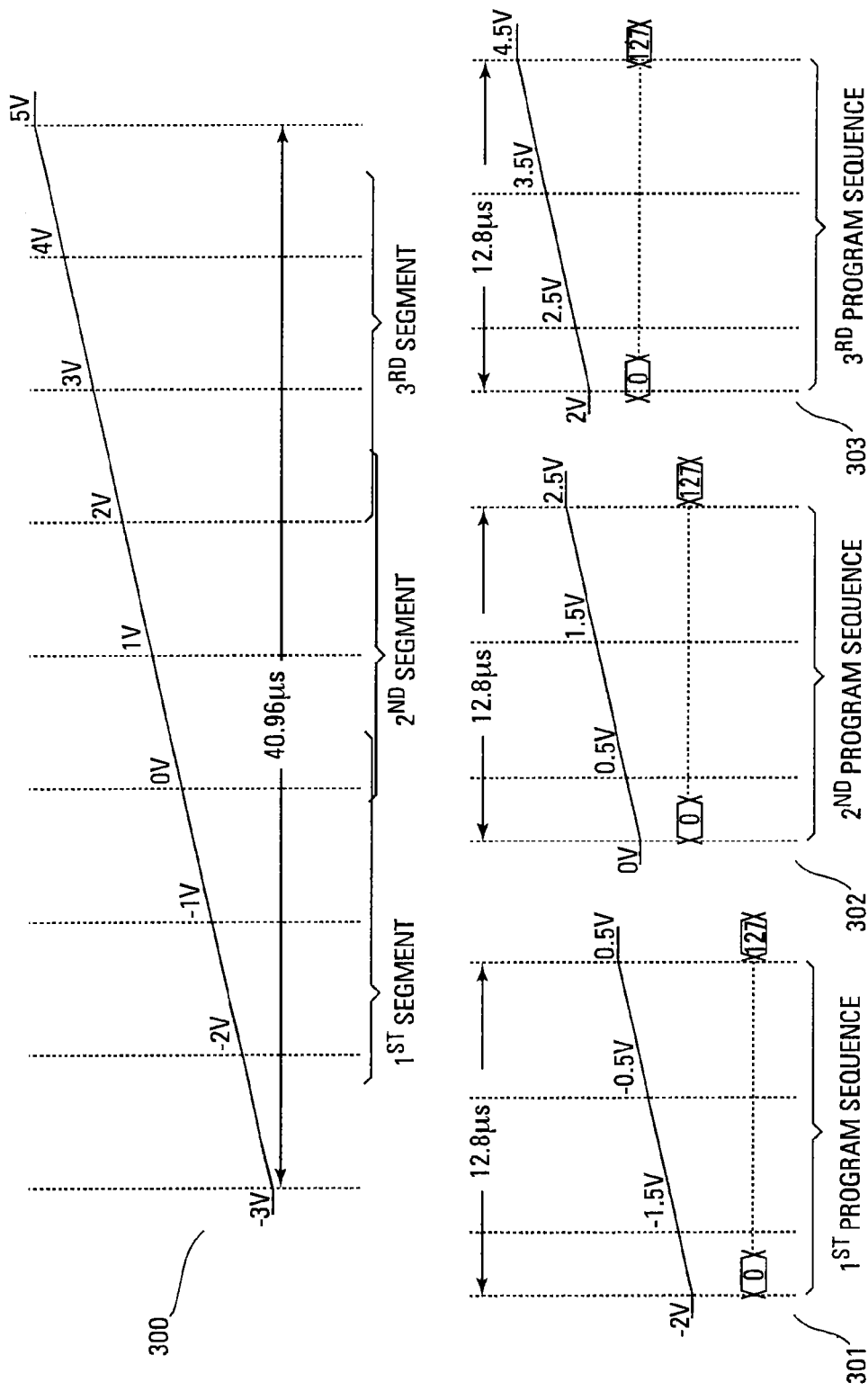
FIG. 3 shows a plot of one embodiment of the segmentation of a program verify operation.

A segmented program verify operation segments (e.g., divides) the program verify ramped voltage signal into multiple segments. FIG. 3 illustrates one example of such a segmented operation. While FIG. 3 and the present discussion refer to three segments, the present embodiments are not limited to any particular number of segments.

FIG. 3 illustrates a typical ramped voltage signal 300 that can be an output of a conventional ramped voltage generator circuit. For purposes of illustration, this ramped voltage signal 300 is assumed to start at –3V and increase to 5V over a time period of 40.96 µs. In one or more embodiments of the present invention, such a ramped voltage signal can instead be segmented into three segments 301-303, where each of the three segments 301-303 has a time period of 12.8 µs.

Each of the three segments 301-303 overlaps with an adjacent segment. For example, the first ramped voltage signal segment 301 has a start voltage of –2V and increases to a stop voltage of 0.5V over a 12.8 µs time period. The second ramped voltage signal segment 302 has a start voltage of 0V and increases to a stop voltage of 2.5V over its respective 12.8 µs time period. The third ramped voltage signal segment 303 has a start voltage of 2V and increases to a stop voltage of 4.5V over its respective 12.8 µs time period. Overlapping a segment with an adjacent segment can increase the possibility that all threshold voltages experienced by the memory cells being programmed are covered by the multiple segments.

The range of each ramped voltage signal segment (e.g., the difference between the stop voltage and the start voltage) can be chosen based on a size of predicted distributions of threshold voltages for memory cells resulting from each programming pulse. For example, if the predicted distribution of threshold voltages for memory cells resulting from each programming pulse is less than 2.5V, then the range of each of the segments 301-303 can be chosen to be 2.5V.

Even with the overlapping segments, it is still possible that a slow programming memory cell might not be verifiable within any of the segments. In such a case, error correction coding might be used to correct the reading of these memory cells. Thus, the number of segments into which a conventional ramped voltage signal 300 is segmented (e.g., broken down) can be a trade-off between the number of memory cells verifiable by the segmented program verify operation and the number of memory cells correctable by the error correction coding.

The number of segments can also be determined by the memory technology. For example, one memory technology might respond to a programming pulse differently than another such that threshold voltage distributions might be wider with one technology than the other. Wider threshold voltage distributions could typically use fewer segments.

Each segment 301-303 illustrated in FIG. 3 also shows the $V_t$ count (0-127) from the most significant seven bits of the counter 110 of FIG. 1. Since the same 128 counts cover a shorter voltage range (e.g., 2.5V) than a conventional non-segmented ramped voltage signal (e.g., 8V), it can be seen that a segmented program verify method can provide an increased write resolution (e.g., voltage range/number of bits) as compared to the prior art.

In one embodiment, the ramp rate of each segment should remain the same as a conventional (non-segmented) ramp rate. This can result in a more easily computed threshold voltage during a read operation due to error correction performed in response to the resistance-capacitance (RC) of each word line. Since a typical word line might be coupled to thousands of memory cells, the RC of each word line can cause the voltage applied to the one end of the word line to be delayed in reaching the other end of the word line. When the ramped voltage signal is a certain voltage on one end of the word line, the actual $V_t$ count that is latched is not delayed and can indicate a different voltage than what actually activated the memory cell. During a programming operation, this difference is compensated by a known offset that is added to data being programmed into memory cells that are furthest from where the ramped voltage signal is applied. This offset takes into account the distance from the applied voltage as well as the ramp rate of the ramped voltage signal. If the ramp rate for the ramped voltage signal segments is different than a conventional ramp rate, different offsets will need to be determined to compensate for the RC error.

Figure 4A:
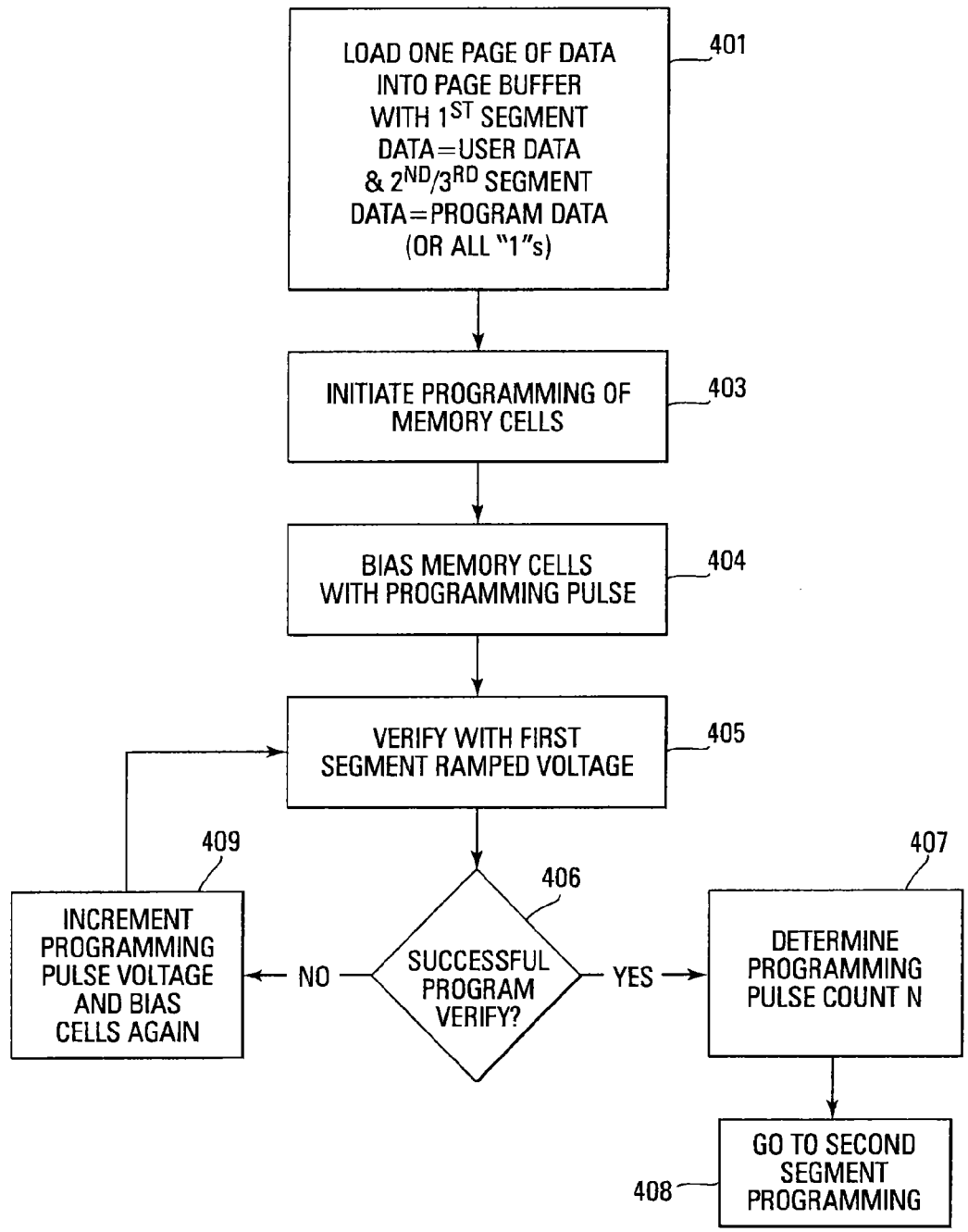
FIGS. 4A-4C show flowcharts of one embodiment of a method for programming incorporating a segmented program verify operation.
Figure 4B:
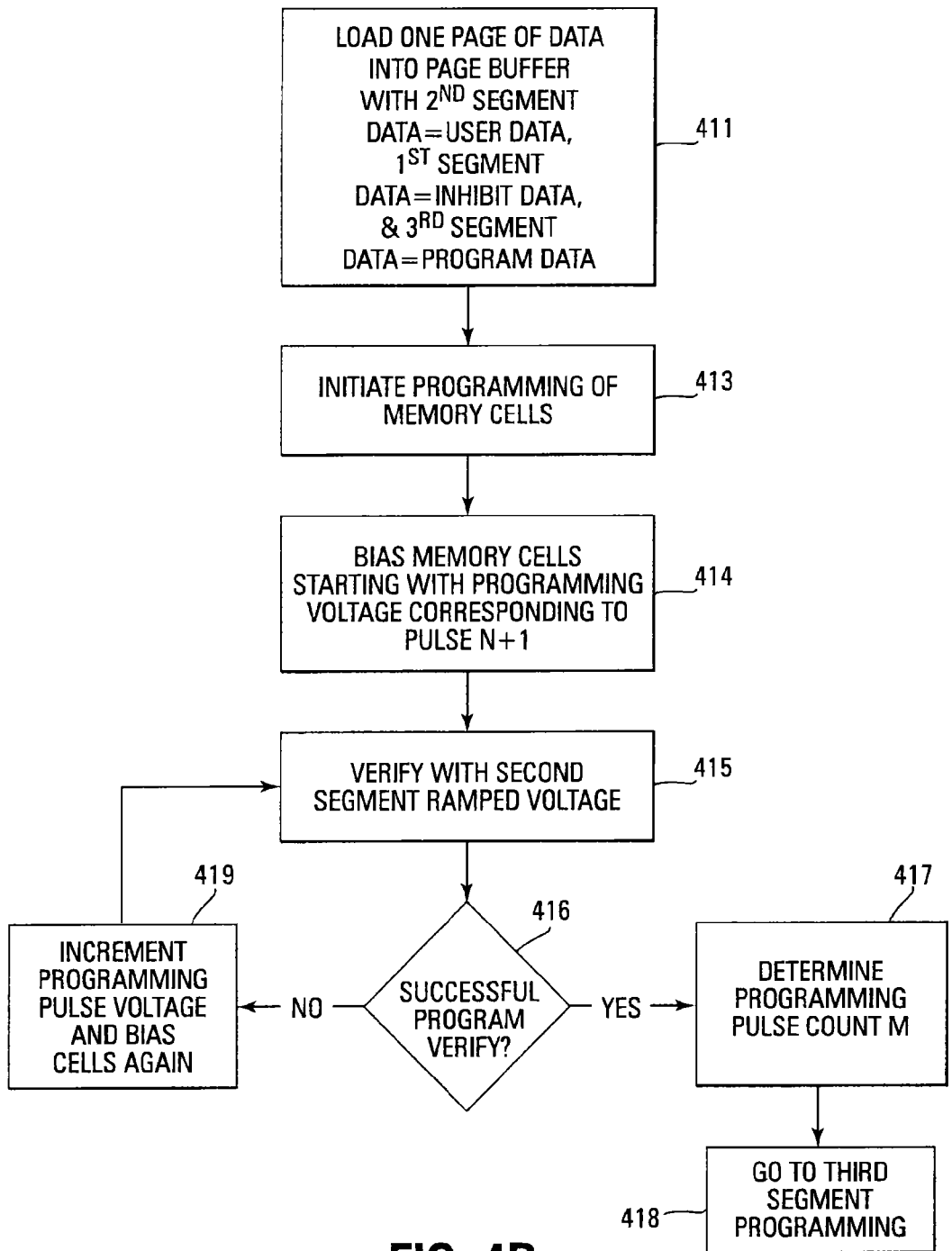
Figure 4C:
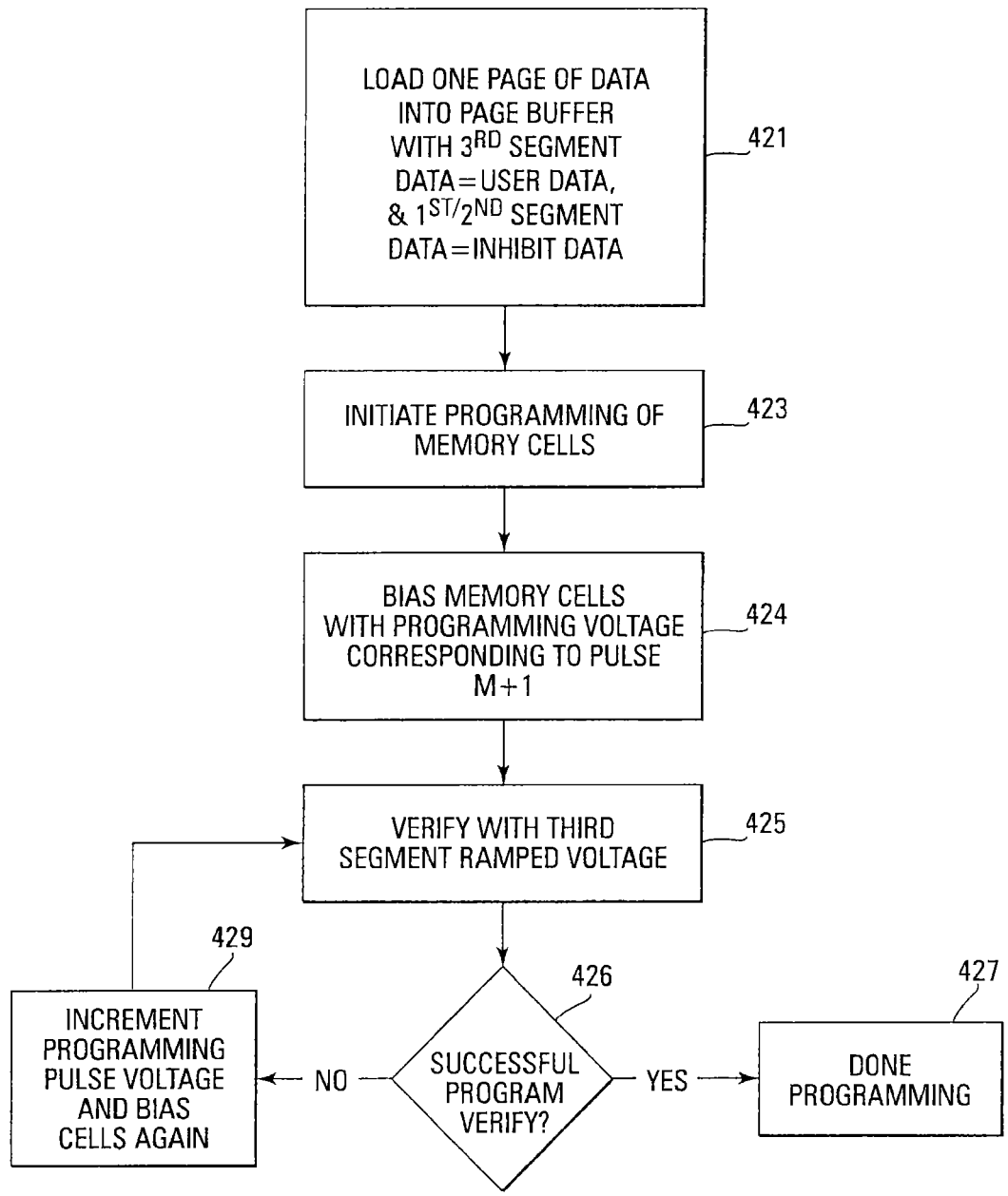

FIGS. 4A-4C illustrate flowcharts of one embodiment of a method for segmented programming (e.g., segmented program verify). In order to illustrate operation of the segmented programming embodiments, the example of FIGS. 4A-4C assumes that the program verify ramped voltage signal has been segmented (e.g., partitioned) into three segments. It is also assumed that each of the memory cells are configured to store three bits per cell so that each memory cell can be programmed to a respective one of eight different states (e.g., L0-L7), as illustrated in FIG. 5. A further assumption is that the programming execution order is from the lowest state (e.g., L0, representing the lowest nominal threshold voltage) to the highest state (e.g., L7, representing the highest programmed nominal threshold voltage). Alternate embodiments can segment a ramped voltage signal into different quantities of segments and/or the memory cells can be configured to be programmed to a respective one of a difference quantity of states. As discussed subsequently, alternate embodiments can also use a different programming execution order, such as one from the highest state to the lowest state.

The method depicted in FIGS. 4A-4C relates to the programming of one grouping of memory cells that comprise the three segments. In one embodiment, this grouping is a page of data. Thus, the page of data will experience three data loading cycles and three programming cycles.

FIG. 4A illustrates the programming of memory cells with the first segment of user data. FIG. 4B illustrates the programming of the memory cells with the second segment of user data. FIG. 4C illustrates the programming of the memory cells with the third segment of user data. In discussing the programming embodiments of FIGS. 4A-4C, reference will be made to the voltage level distributions of FIG. 5.

Since voltage level L0 (e.g., erased state) will not be programmed, memory cells that are to remain at the L0 voltage level will be inhibited from programming. In one embodiment, inhibit data (e.g., logical zeros) are loaded into the page buffer for these memory cells. This instructs the memory control circuitry to inhibit programming of these cells. The following discussions of FIGS. 4A-4C assume that memory cells that are to remain at level L0 are inhibited from programming in some way.

Referring to FIG. 4A, the first segment of the depicted programming operation begins with loading a page of data into a page buffer 401. The page of data can include the user data (as used herein, the term "user data" refers to the actual data to be ultimately programmed to cells, including, for example, overhead data) for a first segment of memory cells, such as those cells to be programmed to one of the L1 or L2 states. The rest of the first page of data (e.g., the data for second and third segments of memory cells) can include program data. As used herein, "program data" can refer to, for example, data that will cause memory control circuitry to attempt to program corresponding memory cells to a highest threshold voltage nominally achievable during the first segment of the programming operation. In one example, the program data can be, for example, all logic ones or data corresponding to state L3. Programming of the page of data is then initiated 403.

The programming comprises biasing the control gates of the first segment memory cells with an initial programming pulse 404 that has an initial programming voltage. A program verify operation is then performed with the first segment ramped voltage 405. One example of such a ramped voltage 301 is illustrated in FIG. 3. It is then determined whether a particular number (e.g., 10) of the memory cells of the second and/or third segment have passed the program verify operation 406. This can be accomplished by sense circuitry detecting current flow in a bit line from the activated memory cells. Determining whether a particular number of the memory cells of the second and/or third segment have passed the program verify operation is dictated by fast-to-program cells in the second and third segments. If the particular number of memory cells pass the program verify operation 406, the programming pulse count N is determined. The second segment of the depicted programming operation is then executed 409.

If the program verify does not indicate that the particular number (e.g., 10) of the memory cells of the second and/or third segment have been successfully programmed, the programming pulse count is incremented again (e.g., increment programming voltage) and the memory cells biased for another programming operation 409. The incremented programming pulses and program verify are repeated 405, 406, 409 until the particular number (e.g., 10) of the memory cells of the second and/or third segment have been successfully programmed or it is determined that a memory cell cannot be programmed, thus resulting in an error condition.

The top plot 501 of FIG. 5 illustrates one embodiment of the results of the first segment of the programming operation depicted in FIG. 4. This plot shows the distributions of the number of memory cells at each state versus the threshold voltage range of the distribution.

The top plot 501 shows the memory cells that were either program inhibited (e.g., L0), have been programmed to their target threshold voltages corresponding to the user data (e.g., L1 and L2), or that have not yet reached their target voltage corresponding to the user data (e.g., distribution 510) after the first segment of the programming operation.

The distributions 510 and 520 illustrated in FIG. 3 do not necessarily represent the final programmed states of memory cells in each segment. These distributions 510 and 520 might cover two or more programmed states of the memory cells.

The second segment of the depicted programming operation, illustrated in FIG. 4B, includes loading the page of data into a page buffer 411. The page of data can include the user data for the second segment of memory cells, such as those cells to be programmed to one of the L3 or L4 states. The page can also include inhibit data (e.g., logical zeros) for the first segment of memory cells, such as to inhibit programming of the first segment of memory cells. Furthermore, the page of data can include program data for the third segment of memory cells. As used herein, "program data" can refer to, for example, data that will cause memory control circuitry to attempt to program corresponding memory cells to a highest threshold voltage nominally achievable during the second segment of the programming operation. In one example, the program data included in the page of data can include data corresponding to state L5. Programming of the page of data is then initiated 413.

Starting at the start voltage of the first ramped voltage signal segment would not be efficient since the second segment memory cells have already been programmed to the highest threshold voltage of the first segment. Thus, the programming pulse count N, determined at the end of the first segment programming operation is incremented (e.g., N+1) and the voltage represented by this programming pulse number is applied to the control gates of the memory cells 414.

A program verify operation is then performed with the second ramped voltage signal segment 415. One example of such a ramped voltage signal segment is illustrated in FIG. 3 as segment 302.

It is then determined whether a particular number (e.g., 10) of the memory cells of the second segment have passed the program verify operation 416. This can be accomplished by sense circuitry detecting current flow in a bit line from the activated memory cells. Determining whether a particular number of the memory cells of the second segment have passed the program verify operation is dictated by fast-to-program cells in the second segment. If the particular number of memory cells of the second segment pass the program verify operation 415, the programming pulse count M is determined. The third segment of the depicted programming operation is then executed 418.

If the program verify does not indicate that the particular number (e.g., 10) of the memory cells of the third segment have been successfully programmed, the programming pulse count is incremented again (e.g., increment programming voltage) and the memory cells biased for another programming operation 419. The incremented programming pulses and program verify are repeated 415, 416, 419 until the particular number (e.g., 10) of the memory cells of the third segment have been successfully programmed or it is determined that a memory cell cannot be programmed, thus resulting in an error condition.

The middle plot 502 of FIG. 5 shows the memory cells that were either program inhibited (e.g., L0), have been programmed to their target threshold voltages corresponding to the user data (e.g., L1-L4), or have not reached their target threshold voltages corresponding to the user data (e.g., distribution 520) after the first and second segments of the depicted programming operation.

The third segment of the depicted programming operation, illustrated in FIG. 4C, includes loading the page of data into a page buffer 421. The page of data can include the user data for the third segment of memory cells, such as those cells to be programmed to one of the L5, L6 or L7 states. The rest of the page of data (e.g., the data for the first and second segments of memory cells) can include inhibit data. Programming of the page of data is then initiated 423.

The programming pulse count M, determined at the end of the second segment of the programming operation, is incremented (e.g., M+1) and the voltage represented by this programming pulse number is used to bias the memory cells 424.

A program verify operation is then performed with the third ramped voltage signal segment 425. One example of such a ramped voltage signal segment is illustrated in FIG. 3 as ramped voltage signal segment 303.

It is then determined whether no more than a particular number (e.g., 10) of the memory cells have failed program verify 426. Determining whether no more than a particular number of the memory cells have failed the program verify operation is dictated by the slow-to-program cells, and can correspond to a conventional way to indicate completion of programming. This can be accomplished by sense circuitry failing to detect current flow in a bit line.

If the program verify does not indicate that no more than a particular number (e.g., 10) of the memory cells have failed program verify, the programming pulse count is incremented again (e.g., increment programming voltage) and the memory cells biased for another programming operation 429. The incremented programming pulses and program verify are repeated 425, 426, 429 until no more than the particular number (e.g., 10) of the memory cells have failed program verify or it is determined that a memory cell cannot be programmed, thus resulting in an error condition.

The lower plot 503 of FIG. 5 shows the memory cells after the first, second, and third segments of the depicted programming operation.

The programming operation depicted in FIGS. 4 and 5 illustrate embodiments that program from the first segment memory cells to the third segment memory cells. In an alternate embodiment, this programming sequence can be reversed so that the third segment memory cells are programmed first, followed by the second segment memory cells, and finally the first segment memory cells. Such an embodiment can have the benefit of reduced program disturb conditions since the higher threshold voltage memory cells are programmed first.

Figure 6:
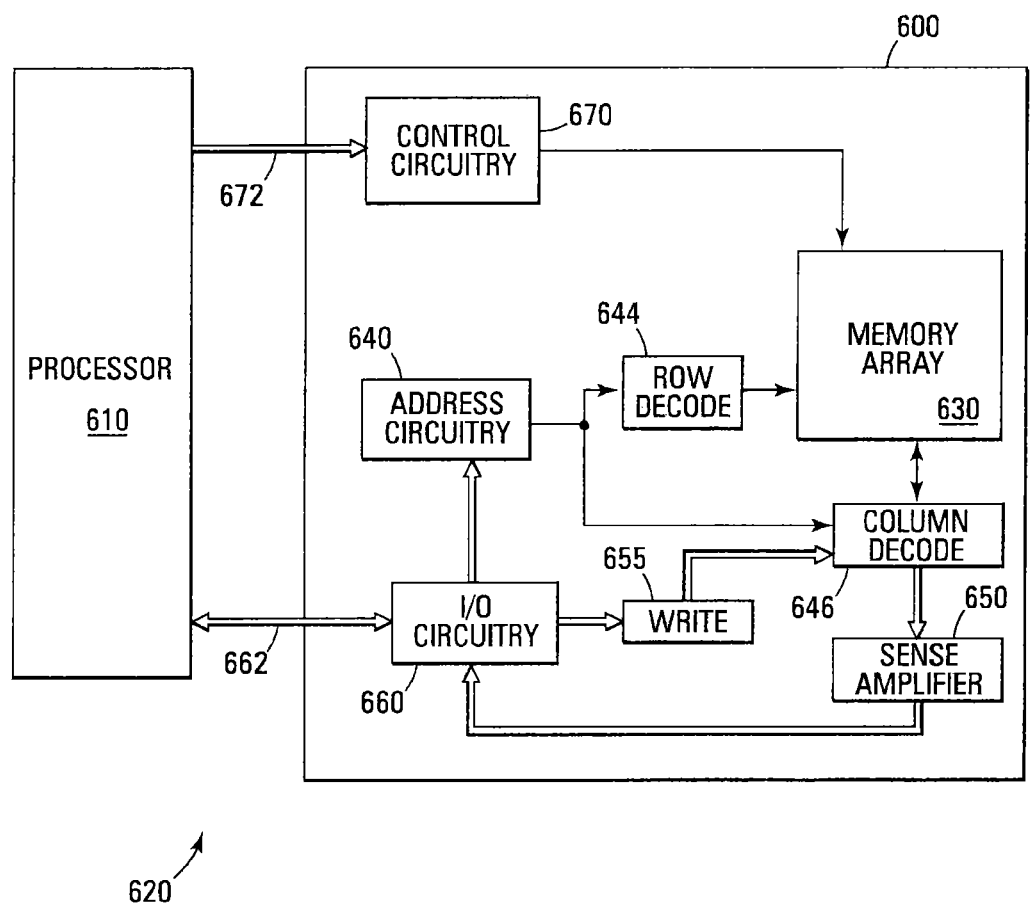
FIG. 6 shows a block diagram of one embodiment of a memory system that can incorporate the program verify circuit of FIG. 1.

FIG. 6 illustrates a functional block diagram of a memory device 600. The memory device 600 is coupled to an external processor 610. The processor 610 may be a microprocessor or some other type of controller. The memory device 600 and the processor 610 form part of a memory system 620.

The memory device 600 includes an array 101 of memory cells (e.g., non-volatile memory cells). The memory array 101 is arranged in banks of word line rows and bit line columns. In one embodiment, the columns of the memory array 101 comprise series strings of memory cells.

Address buffer circuitry 640 is provided to latch address signals provided through I/O circuitry 660. Address signals are received and decoded by a row decoder 644 and a column decoder 646 to access the memory array 101.

The memory device 600 reads data in the memory array 101 by sensing voltage or current changes in the memory array columns using sense amplifier circuitry 650. The sense amplifier circuitry 650, in one embodiment, is coupled to read and latch a row of data from the memory array 101. Data input and output buffer circuitry 660 is included for bidirectional data communication as well as the address communication over a plurality of data connections 662 with the controller 610. Write circuitry 655 is provided to write data to the memory array.

Memory control circuitry 670 decodes signals provided on control connections 672 from the processor 610. These signals are used to control the operations on the memory array 101, including data read, data write (program), and erase operations. The memory control circuitry 670 may be a state machine, a sequencer, or some other type of controller to generate the memory control signals. In one embodiment, the memory control circuitry 670 is configured to control execution of one or more of the segmented programming methods of the present disclosure.

The memory device illustrated in FIG. 6 has been simplified to facilitate a basic understanding of the features of the memory. A more detailed understanding of internal circuitry and functions of flash memories are known to those skilled in the art.

CONCLUSION

In summary, one or more embodiments of the segmented programming methods can provide a faster program verify operation during programming. Instead of using the typical prior art single program verify ramped voltage signal for each program verify operation, a program verify ramped voltage is segmented into a plurality of ramped voltage signal segments, each starting and ending at different verify voltages. A segment of memory cells is then programmed (e.g., programming pulses and program verify operation) until the verify is successful and the next segment is then programmed (e.g., lowest segment to highest segment or highest segment to lowest segment).

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A method of programming memory cells comprising:
   programming a first segment of memory cells with a first segment of data, wherein a first ramped voltage signal segment is used to verify whether the first segment of memory cells is programmed with the first segment of data; and
   programming a second segment of memory cells with a second segment of data, wherein a second ramped voltage signal segment is used to verify whether the second segment of memory cells is programmed with the second segment of data,
   wherein the first ramped voltage signal segment is different than the second ramped voltage signal segment.

2. The method of claim 1, further comprising programming a third segment of memory cells with a third segment of data, wherein a third ramped voltage signal segment is used to verify whether the third segment of memory cells is programmed with the third segment of data.

3. The method of claim 1, wherein control gates of the memory cells of the first and second segments of memory cells are commonly coupled.

4. The method of claim 1, wherein the first ramped voltage signal segment has a same ramp rate as the second ramped voltage signal segment.

5. The method of claim 1, wherein the first ramped voltage signal segments overlaps with the second ramped voltage signal segment.

6. The method of claim 1, wherein a start voltage of the second ramped voltage signal segment is greater than a start voltage of the first ramped voltage signal segment and is less than a stop voltage of the first ramped voltage signal segment.

7. The method of claim 2, wherein a start voltage of the third ramped voltage signal segment is greater than a start voltage of the second ramped voltage signal segment and is less than a stop voltage of the second ramped voltage signal segment.

8. The method of claim 1, wherein the first ramped voltage signal segment has a same time period as the second ramped voltage signal segment.

9. The method of claim 1, wherein the first ramped voltage signal segment has a same range as the second ramped voltage signal segment.

10. The method of claim 1, wherein programming a first segment of memory cells with a first segment of data comprises programming the first segment of memory cells with a first segment of user data and programming the second segment of memory cells with program data.

11. The method of claim 2, wherein programming a first segment of memory cells with a first segment of data comprises programming the first segment of memory cells with a first segment of user data and programming the second and third segments of memory cells with program data; and wherein programming a second segment of memory cells with a second segment of data comprises programming the second segment of memory cells with a second segment of user data and programming the third segment of memory cells with program data.

12. An apparatus comprising:
    memory cells; and
    a controller configured to control execution of a method comprising:
        programming a first segment of the memory cells with a first segment of data, wherein a first ramped voltage signal segment is used to verify whether the first segment of the memory cells is programmed with the first segment of data; and
        programming a second segment of the memory cells with a second segment of data, wherein a second ramped voltage signal segment is used to verify whether the second segment of the memory cells is programmed with the second segment of data.

13. The apparatus of claim 12, wherein the controller is further configured to control generation of the first ramped voltage signal segment to be different than the second ramped voltage signal segment.

14. The apparatus of claim 12, and further comprising a counter coupled to a digital-to-analog converter that is configured to generate the first and second ramped voltage signal segments.

15. The apparatus of claim 14, wherein the first and second ramped voltage signal segments are defined by a start voltage and a stop voltage such that the first ramped voltage signal segment has different start and stop voltages than the second ramped voltage signal segment.

16. The apparatus of claim 14, wherein the counter is configured to output a plurality of count bits wherein the digital-to-analog converter is configured to use only a subset of the plurality of count bits to generate the first and second ramped voltage signal segments.

17. The apparatus of claim 15, wherein the start voltage of the second ramped voltage signal segment is less than the stop voltage of the first ramped voltage signal segment.

18. The apparatus of claim 12, wherein the controller is further configured to use error correction coding on the memory cells.

19. The apparatus of claim 12, wherein the controller is further configured to generate a quantity of segments of ramped voltage signals responsive to a memory technology of the memory cells.

20. The apparatus of claim 12, wherein the memory cells are non-volatile memory cells that are configured as one of a NAND architecture or a NOR architecture.

* * * * *